(12) United States Patent
Tran et al.

(10) Patent No.: US 6,425,991 B1
(45) Date of Patent: Jul. 30, 2002

(54) PLATING SYSTEM WITH SECONDARY RING ANODE FOR A SEMICONDUCTOR WAFER

(75) Inventors: Minh Quoc Tran, San Jose; Christy Mei-Chu Woo, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 5 days.

(21) Appl. No.: 09/678,182

(22) Filed: Oct. 2, 2000

(51) Int. Cl.[7] .......................... C25D 17/00; C25B 9/00; C25B 15/00
(52) U.S. Cl. ................ 204/224 R; 204/267; 204/230.7
(58) Field of Search .............................. 204/267, 230.7, 204/DIG. 7, 24.2, 224 R

(56) References Cited

U.S. PATENT DOCUMENTS 6,251,238 B1 * 6/2001 Kaufman et al. ............ 204/242

* cited by examiner

*Primary Examiner*—Donald R. Valentine
(74) *Attorney, Agent, or Firm*—Mikio Ishimaru

(57) ABSTRACT

An electroplating system is provided for seed layer covered semiconductor wafers. A plating chamber is provided with an inert primary anode connectible to a positive voltage source and a semiconductor wafer connector connectible to a negative voltage source. The plating chamber further contains a consumable ring secondary anode connectible to the positive voltage source such that, when the plating chamber is filled with a plating solution and a semiconductor wafer is connected to the semiconductor wafer connector and the voltages are connected, the seed layer on the semiconductor wafer will be plated by consuming the consumable ring secondary anode.

12 Claims, 1 Drawing Sheet

PLATING SYSTEM WITH SECONDARY RING ANODE FOR A SEMICONDUCTOR WAFER

CROSS-REFERENCE TO RELATED APPLICATION(S)

The present application contains subject matter related to a concurrently filed U.S. Patent Application by Minh Ouoc Tran entitled "PLATING SYSTEM WITH REMOTE SECONDARY ANODE FOR SEMICONDUCTOR MANUFACTURING" and identified by Ser. No. 09/678,503.

The present application also contains subject matter related to a concurrently filed U.S. Patent Application by Minh Quoc Tran and Christy Mei-Chu Woo entitled "PLATING SYSTEM WITH SHIELDED SECONDARY ANODE FOR SEMICONDUCTOR MANUFACTURING" and identified by Ser. No. 09/678,504.

TECHNICAL FIELD

The present invention relates generally to semiconductor manufacturing technology and more specifically to electroplating systems with consumable electrodes.

BACKGROUND ART

In the past in the manufacture of semiconductors, there have been numerous processes which required plating at various stages to deposit various materials on semiconductor wafers. All of these systems generally required human operator monitoring or the addition of plating materials at timed intervals. Since the addition of plating material was deemed to be one which required a certain degree of expertise and experience, it was not thought to be possible to automate this type of operation without complex, and expensive, computer equipment.

As the industry has sought to make smaller and smaller semiconductor devices with finer and finer device connections, it has been found that conventional metallization techniques for making the device connections are inadequate for future generations of products. This has resulted in the shift from materials such as aluminum (Al) to copper (Cu).

Copper is not suited for deposition using the metallization techniques used for aluminum and is better adapted for deposition by electro- or electro-less plating processes out of a solution. With the adoption of the copper interconnect, the device connection technology, there has been a great deal of effort placed into automating copper plating technology for semiconductors. This has meant the introduction of expensive equipment. This in turn has meant that much effort has been expended in trying to reduce costs.

One approach involved a recirculating system for the plating chamber to which more metal ion was added as it was deposited on the semiconductor wafer. The problem with this approach is that there is a need to add metal ion in a chemical compound such as copper sulfate ($CuSO_4$) for Cu, which tends to disturb the stability of the chamber.

A solution for solving this problem simply and inexpensively has been long sought by and eluded those skilled in the art.

DISCLOSURE OF THE INVENTION

The present invention provides an electroplating system for seed layer covered semiconductor wafers in which a plating chamber is provided with an inert primary anode conneetible to a positive voltage source and a semiconductor wafer connector connectible to a negative voltage source. The plating chamber further contains a consumable ring secondary anode connectible to the positive voltage source such that, when the plating chamber is filled with a plating solution and a semiconductor wafer is connected to the semiconductor wafer connector, and the voltages are connected, the semiconductor wafer will be plated by consuming the consumable ring secondary anode. This eliminates the need to add chemicals which disturb the stability of the plating solution and which cause spiking of the metal ions.

The present invention further provides a copper (Cu) electroplating system for copper seed layer covered semiconductor wafers in which a plating chamber is provided with an inert platinum (Pt) anode connectible to a positive voltage source, and a semiconductor wafer connector connectible to connect the copper seed layer to a negative voltage source. The plating chamber further contains a consumable ring secondary anode connectible to the positive voltage source such that, when the plating chamber is filled with a plating solution and a semiconductor wafer is connected to the semiconductor wafer connector, and the voltages are connected, the semiconductor wafer will be plated by consuming the consumable ring secondary anode. This eliminates the need to add copper sulfate ($CuSO_4$) solutions which disturb the stability of the plating solution and which cause spiking of the copper ions).

The above and additional advantages of the present invention will become apparent to hose skilled in the art from a reading of the following detailed description when taken in conjunction with the accompanying drawings.

BEST MODE FOR CARRYING OUT THE INVENTION

Figure 1:
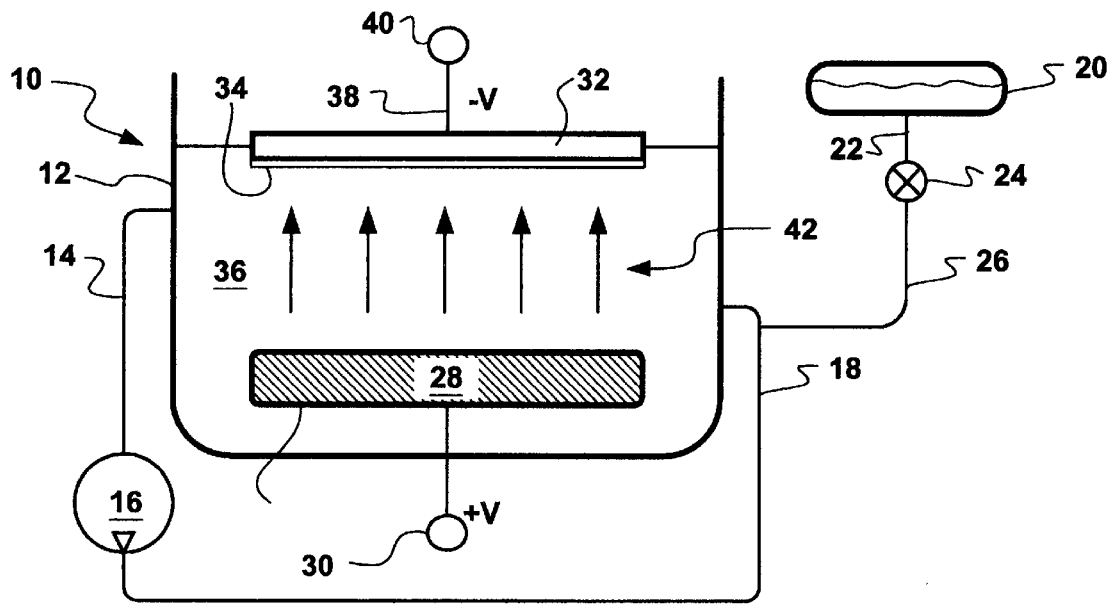
FIG. 1 (PRIOR ART) is an electroplating system.

Referring now to FIG. 1 (PRIOR ART), therein is shown a semiconductor wafer electroplating system 10. The electroplating system 10 includes a plating chamber 12 having an outlet line 14 connected to a recirculating pump 16 which feeds to an inlet line 18 back to the plating chamber 12. A chemical reservoir 20 is connected to a feed line 22 which is connected through a metering valve 24 to a mixing line 26 to the inlet line 18.

Within the plating chamber 12 is an inert anode 28 connected to a positive voltage source 30. The inert anode 28 is generally of a metal such as platinum (Pt) which will not take part in the plating reaction and thus will not be consumed during the plating process.

A semiconductor wafer 32 is processed to form various channels on its bottom face and has been coated with a conductive seed layer 34. The semiconductor wafer 32 is positioned in the plating chamber 12 over the inert anode 28 and in contact with a plating solution 36. The seed layer 34 is connected by a connector 38 to a negative voltage source 40 and acts as the cathode for the plating process.

In operation, when the semiconductor wafer 32 is in place and connected to the negative voltage source 40 and the inert anode 28 is connected to the positive voltage source 30, metal ions are deposited from the plating solution 36 onto the seed layer 34 in an electrochemical deposition process (EDP).

The seed layer 34 and the metal ions are of a metal such as copper (Cu) for copper electroplating. As the metal ions in the plating solution 36 are deposited on the seed layer 34 of the semiconductor wafer 32 under the influence of an electromotive field 42, the plating solution 36 becomes depleted.

When the plating solution 36 becomes depleted, additional metal ions are supplied from the chemical reservoir 20 through the metering valve 24 into the plating chamber 12. For copper (Cu), copper sulfate ($CuSO_4$) solution is contained in the chemical reservoir 20.

While the inert anode 28 is not depleted in the prior art, the addition of copper sulfate disturbs the stability of the plating solution 36 and causes concentration spikes which lead to uneven density of the plated copper as well as uneven distribution along the surface of the semiconductor wafer 32.

Figure 2:
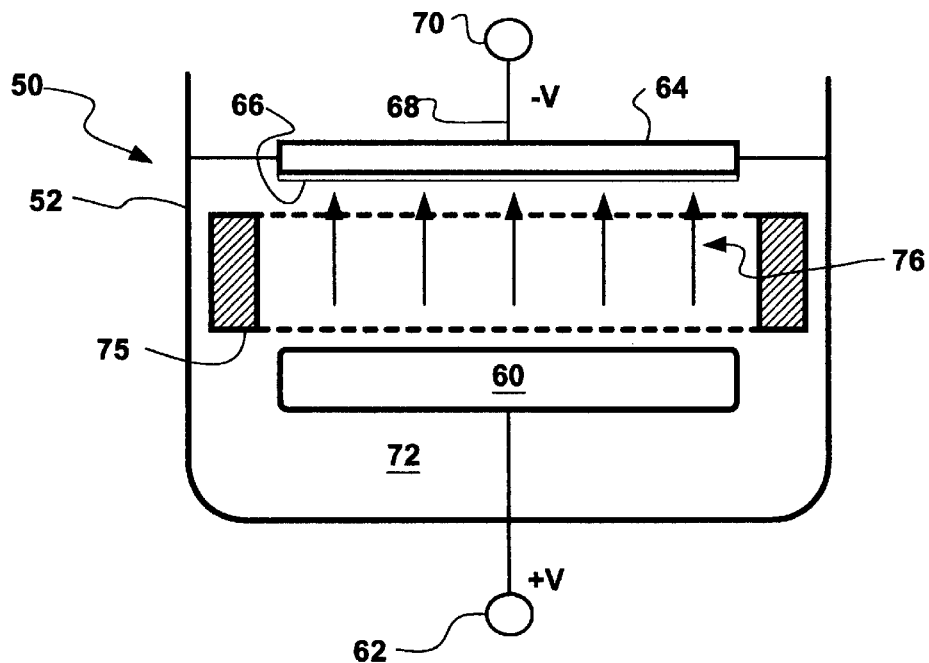
FIG. 2 is an electroplating system according to the present invention.

Referring now to FIG. 2, therein is shown an electroplating system 50 according to the present invention. The electroplating system 50 includes a plating chamber 52 having an inert primary anode 60 connected to a positive voltage source 62. The inert primary anode 60 is of a material, which will not take part in the plating process and which is not consumed, such as platinum (Pt).

Above the inert primary anode 60 is a semiconductor wafer 64 having a conductive seed layer 66 thereon. The seed layer 66 is connected by a cornector 68 to a negative voltage source 70 and acts as the cathode for the plating process.

The semiconductor wafer 64 is positioned so as to place the seed layer 66 in contact with a plating solution 72.

Immersed in the plating solution 72 around the inert primary anode 60 is a consumable ring secondary anode 75. The consumable ring secondary anode 75 is connected to the positive voltage source 62 either directly or through the inert primary anode 60.

The consumable ring secondary anode 75 is a ring, which is larger than the semiconductor wafer 64 so as to allow the electromotive field 76 between the inert primary anode 60 and the seed layer 66 to cause primary deposition of metal ions from the plating solution 72. As metal ions are plated out onto the seed layer 66 of the semiconductor wafer 64, the consumable ring secondary anode 75 replenishes the metal ions. During process, for example for copper plating, the consumable ring secondary anode 75 is of metallic copper and is consumed, and there is no need to use a chemical solution to maintain the metal ion concentration.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the appended claims. All matters hither-to-fore set forth herein or shown in the accompanying drawings are to be interpreted in an illustrative and non-limiting sense.

The invention claimed is:

1. A plating system for a semiconductor wafer comprising:
    a plating chamber;
    an inert primary anode connectible to a positive voltage source;
    a semiconductor wafer connector connectible to connect the semiconductor wafer to a negative voltage source; and
    a consumable secondary anode connectible to the positive voltage source, the consumable secondary anode formed as an annular ring disposed between the inert primary anode and the semiconductor wafer connector.

2. The plating system as claimed in claim 1 wherein the consumable anode is an annular ring larger than the semiconductor wafer.

3. The plating system as claimed in claim 1 wherein the consumable secondary anode is connectible to the inert primary anode.

4. The plating system as claimed in claim 1 wherein the plating chamber is configured to have plating solution cover the inert primary anode and the consumable secondary anode.

5. The plating system as claimed in claim 1 wherein the plating chamber is configured to have plating solution contact the bottom surface of the semiconductor wafer.

6. The plating system as claimed in claim 1 including a positive voltage source and a negative voltage source.

7. A copper plating system for a copper seed layer covered semiconductor wafer comprising:
    a plating chamber;
    an inert platinum anode connectible to a positive voltage source;
    a semiconductor wafer connector connectible to connect the copper seed layer to a negative voltage source; and
    a consumable secondary copper anode connectible to the positive voltage source, the consumable secondary copper anode formed as an annular ring disposed between the inert primary anode and the semiconductor wafer.

8. The copper plating system as claimed in claim 7 wherein the consumable secondary copper anode is an annular ring larger than the semiconductor wafer and is positioned between the inert primary anode and the semiconductor wafer connector.

9. The copper plating system as claimed in claim 7 wherein the consumable secondary copper anode is connectible through the inert platinum anode to the positive voltage source.

10. The copper plating system as claimed in claim 7 wherein the plating chamber is configured to have a copper ion containing plating solution cover the inert platinum anode and the consumable secondary copper anode.

11. The copper plating system as claimed in claim 7 wherein the plating chamber is configured to have a copper ion plating solution contact the copper seed layer of the semiconductor wafer.

12. The copper plating system as claimed in claim 7 including a positive voltage source and a negative voltage source.

* * * * *